United States Patent [19]

Woo

[11] Patent Number: 5,227,648

[45] Date of Patent: Jul. 13, 1993

[54] RESONANCE CAVITY PHOTODIODE ARRAY RESOLVING WAVELENGTH AND SPECTRUM

[76] Inventor: Jong-Chun Woo, Hannam Heights, 1-805, Oksoo-Dong, Sungdong-ku, Seoul 131-100, Rep. of Korea

[21] Appl. No.: 801,041

[22] Filed: Dec. 3, 1991

[51] Int. Cl.$^5$ .......................................... H01L 27/14
[52] U.S. Cl. ................................ 257/185; 257/443; 257/432; 257/466; 359/248; 359/260; 359/263
[58] Field of Search ............ 357/30 P, 30 H, 30 G, 357/30 R, 30 L, 16, 4, 32, 30 E, 30 P, 30 D; 359/260, 261, 263, 248; 257/466, 432, 443

[56] References Cited

U.S. PATENT DOCUMENTS

| | | | |
|---|---|---|---|
| 4,620,209 | 10/1986 | Parker et al. | 357/32 X |
| 4,665,421 | 5/1987 | Borner et al. | 357/30 P |
| 4,956,686 | 9/1990 | Borrello et al. | 357/32 X |

FOREIGN PATENT DOCUMENTS

| | | | |
|---|---|---|---|
| 58-119680 | 7/1983 | Japan | 357/30 L |
| 60-97681 | 5/1985 | Japan | 357/30 P |
| 61-229371 | 10/1986 | Japan | 357/30 L |
| 62-267624 | 11/1987 | Japan | 357/32 |

OTHER PUBLICATIONS

Woodall, "Optical Communications Link", *IBM Technical Disclosure Bulletin*, vol. 12, No. 10, Mar. 1970, pp. 1584–1585.

J. P. van der Ziel et al., "Multilayer GaAs-Al$_{0.3}$Ga$_{0.7}$As Dielectric Quarter Wave Stacks Grown by Molecular Beam Epitaxy", *Applied Optics*, vol. 14, No. 11, pp. 2627–2630 (1975).

P. L. Gourley et al, "Single Crystal, Epitaxial Multilayers of AlAs, GaAs, and Al$_x$Ga$_{1-x}$As for Use as Optical Interferometic Elements", *Appl. Phys. Lett.*, vol. 49, No. 9, pp. 489–491 (1986).

P. L. Gourley et al, "Visible, Room-Temperature, Surface-Emitting Laser Using an Epitaxial Fabry-Perot Resonator with AlGaAs/AlAs Quarter-Wave High Reflectors and AlGaAs/GaAs Multiple Quantum Wells", *Appl. Phys. Lett.*, vol. 50, No. 18, pp. 1225–1227 (1987).

Mutsuo Ogura et al, "Surface-Emitting Laser Diode with Vertical GaAs/GaAlAs Quarter-Wavelength Multilayers and Lateral Buried Heterostructure", *Appl. Phys. Lett.*, vol. 51, No. 21, pp. 1655–1657 (1987).

*Primary Examiner*—William Mintel
*Attorney, Agent, or Firm*—Burns, Doane, Swecker & Mathis

[57] ABSTRACT

A photodiode array composed of sharply tuned at consecutively different wavelengths are disclosed with the vertical resonance cavity. Semiconductor superlattice distributed Bragg reflectors can be used as the resonance cavity to achieve sharp tuning and monolithic integration, and the wedged distributed Bragg reflector configuration resonance cavity provides a sequential wavelength detection range. A linear array having resolution a fraction of the photodiodes bandwidth and a square-matrix array with a wedged etalon for high resolution, are disclosed. The disclosed photodiode array make a pocket-type wavelength meter feasible and can be used as a substitute for a spectrometer.

3 Claims, 3 Drawing Sheets a: d = 113.83 (nm)   b: d = 146.47 (nm)

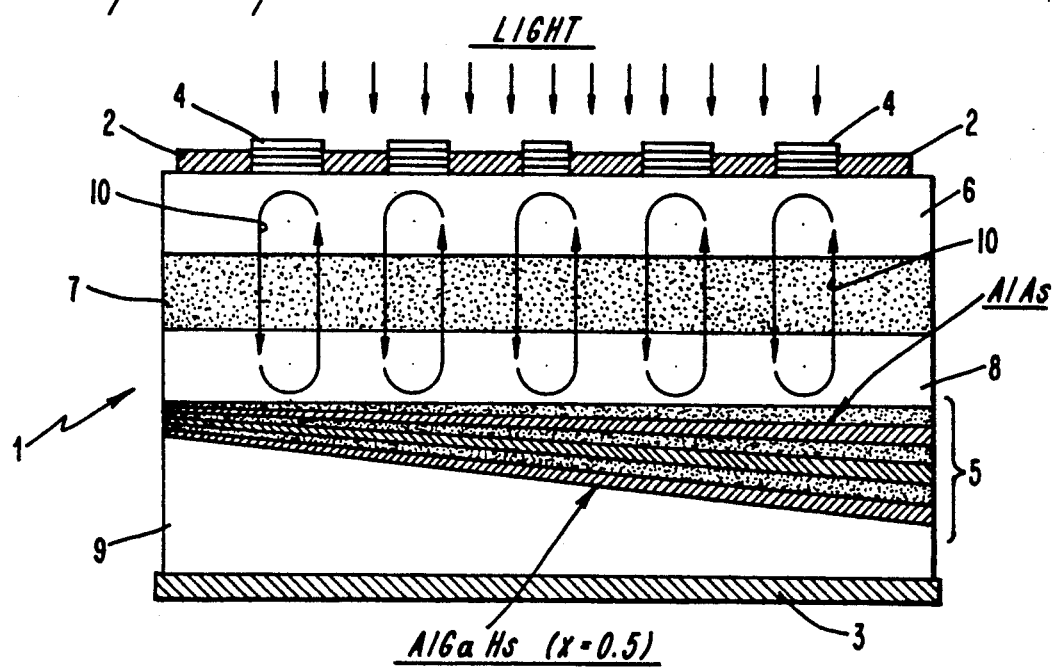
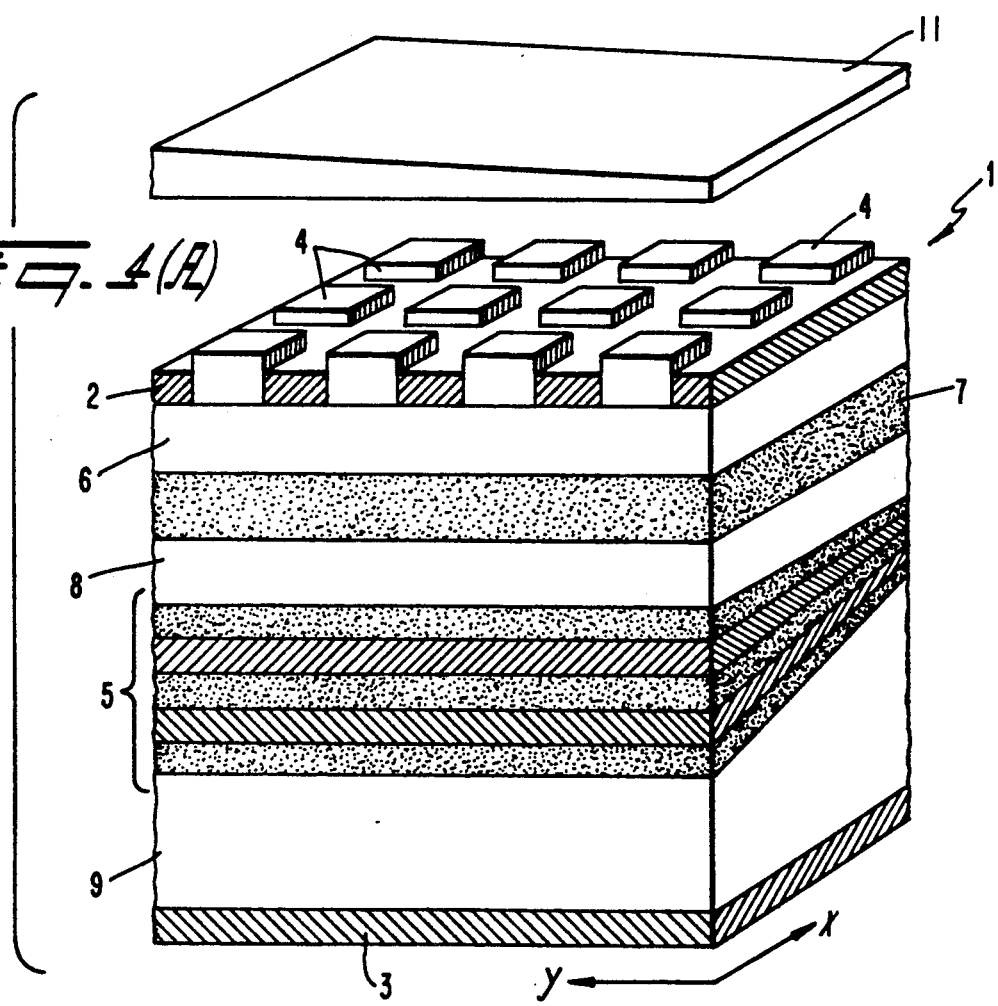

_(5,227,648)_

RESONANCE CAVITY PHOTODIODE ARRAY RESOLVING WAVELENGTH AND SPECTRUM

TECHNICAL FIELD

This invention relates to a semiconductor chip of photodiodes (PD) array, which is composed of a series of sharply tuned PD of consecutive wavelength range and thus can be used to detect the wavelength of the light. This array chip with an associated electronic instrument can replace spectrometers in the measurement of the wavelength.

The most common and probably only means of measuring the wavelength of light is with a spectrometer system, which is an assembly of a spectrometer (e.g., grating type), a photodetector (e.g., PD or photo-multiplier tube) and related electronic instruments (e.g., meters and counter). The physical size of a spectrometer using geo-optical components such as a grating or prism is bulky and is difficult to reduce because it is directly related to its resolution. The readout of a spectrometer is the measurement of diffraction angle against the wavelength, and requires calibration. It also requires professional care in handling and maintaining just as all other delicate instruments do. Thus, measuring the wavelength with a spectrometer requires training and skill in the operation.

If a simple meter can replace a spectrometer system in the wavelength measurement, it will not only make such a measurement easy and popular, but will also relieve the difficulties which a spectrometer system provide, such as space, operation and maintenance problems. The measurement of wavelength will no longer be the art of the specialist, but can be the work of a layman. This situation would be analogous to the case that, in electric resistance measurement, a chip used in a digital multi-meter replaces an instrumental set-up combined with a voltmeter, ammeter and voltage source. The proposed resonent-cavity (RC) photodiode (PD) array, a semiconductor chip of less than a millimeter square, will provide the means of substituting for the role of the spectrometer system. The wavelength meter with RC PD array can become a pocket-type gadget, and will need little mechanical and optical adjustment. A pocket-type spectrometer will provide an innovation in the field of spectroscopy.

In light intensity detection, the PD in an array form is a very popular device with wide application in many areas. The device fabrication techniques of the general purpose PD array are well-established, and the concept of a resonant optical cavity in a semiconductor opto-electronic (OE) device is as old as the laser diode.

However, the resonant optical cavity composed of vertical reflectors, which can be monolithically integrated to OE devices, is a recent development. The superlattice (SL) of a quarter-wave stack, called a distributed Bragg reflector (DBR) [P. J. van der Ziel and M. Ilegems, _Appl. Opt._, 14. 2627 (1975)], is often used as a vertical reflector to form a single crystal Fabry-Perot (F-P) resonator [P. L. Gourley and T. J. Drummond, _Appl. Phys. Lett._, 49. 489 (1986)]. Vertical (surface) emission laser diodes demonstrated by P. L. Gourley, et. al. [P. L. Gourley and T. J. Drummond, _Appl. Phys. Lett._, 50. 1225 (1987)] and M. Ogura, et. al. [M. Ogura, W. Hsin, M-C Wu, S. Wang, J. R. Whinnery, S. C. Wang and J. J. Yang, _Appl. Phys. Lett._, 51, 1655 (1987)] are typical examples of using an SL DBR. This recent achievement of nanostructure OE devices is closely related to the epitaxial growth technique with atomic scale precision, such as MBE and MOCVD.

SUMMARY OF THE INVENTION

An object of the invention is to provide a linear array of photodiodes for use in detecting the wavelength of light.

Another object of the invention is to provide a square matrix array of narrow-band photodiodes.

A further object of the invention is to provide a monolithic integration of linear and square-matrix array photodiodes.

The above objects can be attained by a semiconductor chip having a linear photodiode array according to the invention, which comprises a series of sharply tuned photdiodes with narrow bandwidth which differ consecutively.

The above objects can also be attained by a semiconductor chip having a square matrix array according to the invention, which comprises a series of sharply tuned photodiodes with narrow bandwidth, wherein said photodiodes that are aligned in one direction (x-direction) having coarse differences of the responding bandwidth by one reflector and aligned by another direction (y-direction) having no or fine differences of the responding bandwidth by another reflector.

With this invention, a simple, care-free gadget using the proposed RC PD array chip can substitute for the roles and the functions of a spectrometer in wavelength measurement as well as relative intensity. This chip can also be utilized for the selective detection of a multi-wavelength optical signal, for example, in the case of multi-color optical communication.

In the prefered embodiment of the invention, a semiconductor chip comprises a PD array, each component of which is sharply tuned to a different wavelength of reasonably narrow bandwidth, and with no duplication in the tunning range among the PD's. However, the step of the wavelength difference among the PD is nearly the same or less than the linewidth. The sharp tuning with a narrow bandwidth can be achieved with a resonant vertical cavity of the F-P type. If the F-P cavity is formed with a pair of reflectors of gradual difference in separation, different horizontal spots of the F-P will have reflectances tuned at different wavelengths; however, the change of the tuned frequency will vary continuously along the horizontal displacement.

One of the possible resonant reflectors is an SL DBR. If we make a distributed Bragg reflector having a gradual difference in layer thickness (hereinafter, referred to as a "wedged DBR"), different horizontal spots of the wafer will have reflectances tuned at different wavelengths.

By knowing which photodiode in the array responds to the light, we can tell the wavelength of the incident light with the accuracy of the resonance bandwidth of the photodiode. In this case, the bandwidth will be the resolution.

However, if the horizontal separation of the photodiodes is made to be a fraction of the bandwidth, the resolution can be improved. For example, if the separation between the PD's becomes one half of the linewidth, two PD's will respond to a monochromatic light and, thus, the resolution will be improved by a factor of two.

BRIEF DESCRIPTION OF THE DRAWINGS

The present invention will be illustrated in detail by means of the accompanying drawings, wherein:

FIGS. 1A and 1B show schematic response curves of each component of the PD array chip according to the invention, wherein FIG. 1A shows that each PD has a responding wavelength region adjacent to the responding wavelength region of another PD with little overlapping, and FIG. 1B shows that two or even more number of PD's in the array may have overlapping wavelength regions in the response;

FIG. 3 shows a schematic diagram of the cross-section of a PD array whose RC is formed with a wedged superlattice quarter-wavelength DBR;

FIG. 4(A) shows a schematic diagram of the cross-section and arrangement of a square matrix array with a wedged solid etalon at the top for fine resolution according to the invention.

DETAILED DESCRIPTION OF THE INVENTION

Figure 1A:
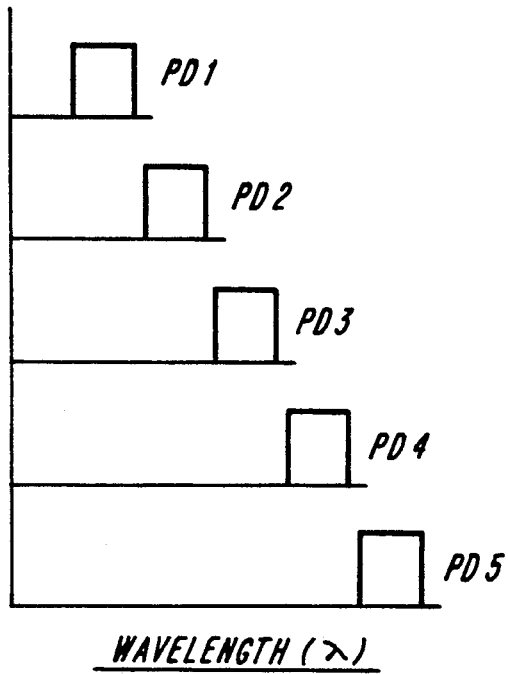
Figure 1B:
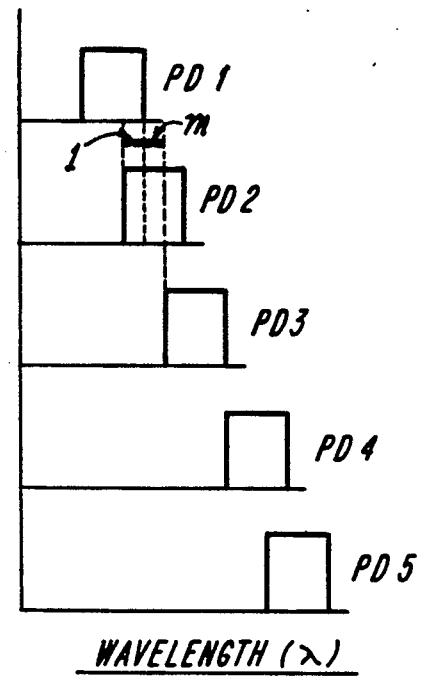

In accordance with the invention, the chip is made in the form of linear or 2-dimensional (2-D) matrix array of numerous PD's, in which each of the PD components has a narrow band response in wavelength and their responding regions are adjacent each other in sequence with continuity, as shown in FIG. 1. As in the case of FIG. 1A, if there is little duplication in the responding wavelength, one PD will respond to the nearly monochromatic light. In this case, the resolution will be the bandwidth of the PD's. If the array is constructed with PD's whose tuned bands are overlapping, as in the case of FIG. 1B, a different combination of the PD's responses will indicate the wavelength as shown by arrows l and m. In the wavelength range indicated with the arrow l, only one PD, i.e. PD1, would respond, while in the wavelength range indicated with the arrow m, two PD's, i.e., PD1 and PD2, would respond. In this case, the resolution can be improved by the value better than that of the bandwidth.

Figure 2:
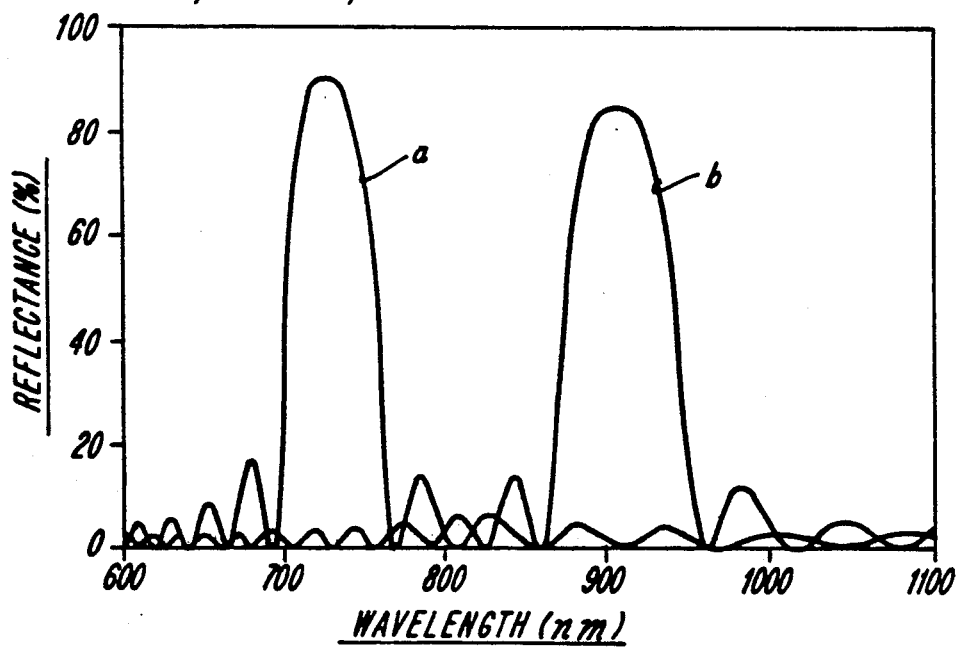
FIG. 2 shows a reflectance spectrum of a distributed Bragg reflector, which gives a good example of a sharply tuned resonant cavity photodiode array according to the invention.

It is well-known that the DBR has a well-tuned reflectance and that the tuning range can easily be changed by controlling the layer thickness. An example is shown in FIG. 2 with an SL DBR constructed with 18 periods of $Al_{0.5}Ga_{0.5}As$ and AlAs. The wavelength-dependent characteristic curve a is the DBR of 54.5 nm thick $Al_{0.5}Ga_{0.5}As$ and 59.3 nm thick AlAs layers with a maximum reflectance of approximately 90% at $\lambda = 720$ nm and the linewidth (FWHM) of 60 nm, and the other curve b is the one of 70.1 nm and 76.3 nm layers tuned at $\lambda = 720$ nm with almost the same characteristics. If the SL DBR is used to form the resonant cavity of the PD, the response of the PD is highly tuned at the high reflectance region of the DBR.

Even though the above example is good for the wavelength region between approximately 600 and 800 nm, similar examples can be found for other kinds of semiconductors. Other combinations of Groups III–V, such as InGaAs and InAlAs, are examples for the longer wavelength region and those of Groups II–VI compound semiconductors, such as CdZnSe and ZnSeTe, for the shorter wavelength region.

The gradual change of the tuned region of the RC PD can be achieved by adopting the wedged SL DBR. An example is presented with a device fabricated with GaAs and AlAs alloys. On an n-type GaAs substrate, after the growth of an n-type GaAs cladding layer, the wedged SL DBR composed of AlAs and $Al_{0.5}Ga_{0.5}As$ doped with n-type dopants was grown first, then n-type GaAs followed by undoped GaAs active layer and p-type GaAs cladding layer may be grown. The GaAs-AlAs wafer described above as an example is grown by the molecular beam epitaxial method (MBE) in its entirety, or by MBE up to the wedged DBR and then by other methods, such as liquid or vapor phase epitaxy.

EXAMPLE 1

Linear Array

The first scheme is a linear array. On the wafer described above, a p contact 2 and an n contact 3 which are electrodes and a top reflector (broad $\lambda$ reflector) 4 are fabricated such that they are aligned linearly. The wafer 1 thus prepared is processed such that PD elements were aligned along the wedged direction so that each PD element had a different tuning band. The difference in tuning range between the adjacent PD elements was determined by their horizontal separation. The schematic diagram of the cross-section of the PD array with RC composed of a wedged SL DBR 5 at the bottom, and another broad band reflector 4 at the top is shown in FIG. 3. The top reflector 4 may have a reflectance nearly independent of the wavelength, but it can be a wedged DBR. However, if the top reflector 4 is a wedged DBR, it should be tuned identically with the bottom one, and then the quantum efficiency of the PD elements in the array would be enhanced. However, matching the reflectance spectra of the two reflectors was technically difficult. In this example, non-explained elements 6, 7, and 8 are those forming PD's of various kinds, element 9 is a substrate, and the circles marked as 10 indicate a photon path, respectively.

In this example, the SL DBR 5 constructed with 18 periods of $Al_{0.5}Ga_{0.5}As$ and AlAs was used. For the DBR 5 grown with a thickness gradient of 50 nm (e.g., 80 nm to 130 nm) for the horizontal displacement of 600 $\mu m$, two adjacent PD elements separated by 10 $\mu m$ had a difference in spectral response of $\Delta\lambda = 5$ nm. Thus, when an array was constructed with PD elements in 10 $\mu m$ intervals, the spectral resolution of the array was 5 nm.

EXAMPLE 2

2-D Matrix Array

On the wafer 1 of the same structure as the linear array, the electrodes (p contact 2 and n contact 3) are fabricated in such a way that PD elements formed a square matrix. The PD elements were aligned such that one axis of the matrix was aligned along the DBR 5 wedged direction (x-axis). Then, a wedged solid etalon 11 was introduced to be aligned along the y-axis, perpendicular to the wedged direction of the DBR 5.

A schematic diagram is shown in FIG. 4(A). The wedged etalon 11 may be installed externally, or it can be fabricated directly on the top of the wafer 1.

The etalon 11 should have a free spectral range comparable to the resolution of the corresponding linear array, and it should be wedged to have a thickness difference of both ends equal to the resolution of PD elements in x-axis. Then, PD elements aligned along the y-axis will respond to the interference of the etalon 11, and thus give higher resolution which corresponds to a fraction of the resolution along x-axis.

For light of 1 μm in wavelength, for example, the wedged etalon 11 was gradually sloped with a thickness of 100 μm at one end and 101 μm at other end. This etalon had a free spectral range of approximately 10 nm. When ten PD elements were placed along the wedged direction, each PD element had a resolution of 1 nm.

Figure 4B:
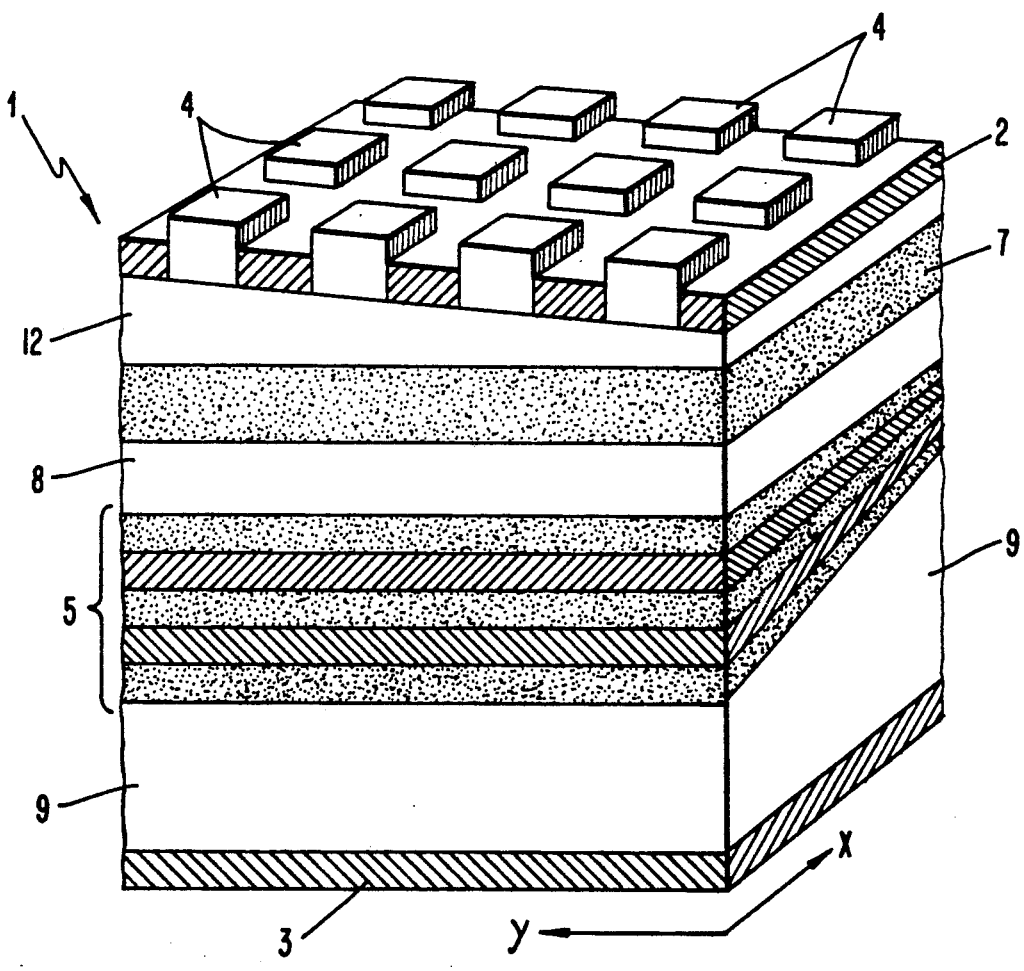
FIG. 4(B) shows a schematic diagram of the cross-section and arrangement of a square matrix array with a wedged etalon inserted as an integral part of the chip at the top according to the present invention.

As illustrated in FIG. 4(B) the wedged etalon 12 can be fabricated at the top of the chip to form one piece.

What is claimed is:

1. A semiconductor chip having a linear photodiode array comprising:
   a series of tuned photodiodes having a tuning sharpness of nanometers in wavelength based on a thickness gradient and a separation of adjacent photodiode elements, wherein the photodiodes further comprise a vertical Fabry-Perot resonance cavity having two reflectors, one of the reflectors being a wedged distributed Bragg reflector and a second of the reflectors being a plane reflector.

2. A semiconductor chip having a square matrix photodiode array comprising:
   a series of tuned photodiodes having a tuning sharpness of nanometers in wavelength based on a thickness gradient and a separation of adjacent photodiode elements, wherein photodiodes having a coarse difference in bandwidth response are aligned in one direction and photodiodes having a fine difference in bandwidth response are aligned in another direction, and
   two wedged etalons each having a thin side and a thick side, one of said two wedged etalons being monolithically fabricated in the form of a distributed Bragg reflector and having a thin side disposed in a first orientation relative to said semiconductor chip, and another of said two wedged etalons being installed externally and having a thin side disposed in an orientation different from said first orientation.

3. A semiconductor chip having a square matrix photodiode array comprising:
   a series of tuned photodiodes having a tuning sharpness of nanometers in wavelength based on a thickness gradient and a separation of adjacent photodiode elements, wherein photodiodes having a coarse difference in bandwidth response are aligned in one direction and photodiodes having a fine difference in bandwidth response are aligned in another direction, and
   two wedged etalons each having a thin side and a thick side, one of said two wedged etalons being monolithically fabricated in the form of a distributed Bragg reflector and having a thin side disposed in a first orientation relative to said semiconductor chip, and another of said two wedged etalons being fabricated on top of the semiconductor chip and having a thin side disposed in an orientation different from said first orientation.

* * * * *